(12) United States Patent
Yoo

(10) Patent No.: US 6,862,404 B1
(45) Date of Patent: Mar. 1, 2005

(54) FOCUSED PHOTON ENERGY HEATING CHAMBER

(75) Inventor: Woo Sik Yoo, Palo Alto, CA (US)

(73) Assignee: WaferMasters, San Jose, CA (US)

( * ) Notice: Subject to any disclaimer, the term of this patent is extended or adjusted under 35 U.S.C. 154(b) by 0 days.

(21) Appl. No.: 10/658,227

(22) Filed: Sep. 8, 2003

(51) Int. Cl.[7] .............................................. F26B 19/00
(52) U.S. Cl. ...................... 392/416; 392/418; 219/390; 219/405; 219/411; 118/724; 118/725; 118/50.1
(58) Field of Search ................................ 219/390, 405, 219/411; 118/724, 725, 50.1; 392/416, 418

(56) References Cited

U.S. PATENT DOCUMENTS

| 4,023,904 | A | * | 5/1977 | Sheets ........................ 355/132 |
| 4,989,544 | A | * | 2/1991 | Yoshikawa ........... 118/723 MP |
| 6,437,290 | B1 | * | 8/2002 | Shao et al. .................. 219/390 |
| 6,717,158 | B1 | * | 4/2004 | Gat et al. ................. 250/492.2 |

* cited by examiner

Primary Examiner—Shawntina Fuqua
(74) Attorney, Agent, or Firm—MacPherson Kwok Chen & Heid LLP; Tom Chen

(57) ABSTRACT

An apparatus and method for heating substrates, such as semiconductor wafers. A radiation energy source is arranged proximate to a reflector to direct radiation towards a window providing optical access to a processing chamber. A lens positioned outside of the window focuses the radiation emitted from the radiation energy source and reflector and directs it through the window. The focused radiation energy can be used to directly or indirectly heat a semiconductor wafer disposed the processing chamber.

18 Claims, 3 Drawing Sheets

FOCUSED PHOTON ENERGY HEATING CHAMBER

BACKGROUND

1. Field of the Invention

This invention generally relates to semiconductor manufacturing equipment and, more particularly, to an apparatus and method used for the processing of semiconductor wafers.

2. Description of the Related Art

In the semiconductor industry, advancements in the development of semiconductor devices of decreased dimensions require the development of new processing and manufacturing techniques. One such processing technique is known as Rapid Thermal Processing (RTP). The RTP technique reduces the amount of time that a semiconductor device is exposed to high temperatures during processing. The RTP technique, typically includes irradiating the semiconductor device or wafer with sufficient power to rapidly raise the temperature of the wafer and maintaining the temperature for a time period long enough to successfully perform a fabrication process, but which avoids such problems as unwanted dopant diffusion that would otherwise occur during longer exposure to high processing temperatures.

Generally, conventional RTP systems use a radiation source and reflectors to heat the bulk of the semiconductor wafer. The radiation source is usually a bank of lamps that emit radiation energy that is focused on the wafer by the reflectors.

Conventional lamp-based RTP systems have considerable drawbacks with regard to achieving and maintaining a uniform temperature distribution across the active layer of the wafer surface. By applying more power to the filament, the power intensity of the lamp may be increased. However, the power density of direct radiation is limited by the rating of lamps and further by packing density of the lamps.

Temperature fluctuations occur on the surface of the wafer which may cause crystal defects and slip dislocations in the wafer at high temperatures (e.g. ~1000 ° C). Further, the heating ramp rate and maximum temperature achievable are limited by the power density of the lamps.

For the above reasons, what is needed is an apparatus and method for uniformly and controllably heating the surface of a semiconductor wafer during rapid thermal processing.

SUMMARY

The present invention includes an apparatus and method for heating substrates, such as semiconductor wafers. In the present invention, a radiation energy source is arranged proximate to a reflector to direct radiation towards a window providing optical access to a processing chamber. A lens positioned outside of the window can efficiently focus the radiation emitted from the radiation energy source and reflector and direct it through the window. The focused radiation energy can be used to directly or indirectly heat a semiconductor wafer disposed in the processing chamber. The use of the lens to focus the intensity of the radiation significantly improves the thermal uniformity and ramp rate of the design.

The radiation from the radiation energy source can be focused and directed by the lens through the window towards a heat absorbing member on which the wafer is placed. By heating the heat absorbing member, the wafer can be subjected to more uniform heating and thus, the apparatus can provide reproducible results. The intense heating of the heat absorbing member also allows for a high heating ramp rate.

Since the radiation from the radiation energy source is focused and directed the power density the radiation provides can be tailored without regard for the rating of the radiation energy source. For example, if the radiation energy source is a bank of lamps, the rating of the lamps would not be a substantial factor. Further, the radiation energy source is not limited by packing density. For example, if the radiation energy source is a bank of lamps, the size of the bank would not matter since the radiation is collected from all of the lamps and focused.

In one aspect of the invention, an apparatus is provided for heating a semiconductor substrate. The apparatus includes a chamber having a window providing optical access to the interior of said chamber. A radiation energy focusing assembly positioned in an optical path with the window is provided to focus radiation energy emitted from a radiation energy source into the window. The focused radiation energy can be used to heat a semiconductor substrate disposed in the chamber.

In another aspect of the present invention, a method is provided for processing a semiconductor substrate including providing a chamber having a window which allows for optical access along an optical path to an interior of the chamber. The method also includes generating radiation energy from a radiation source; concentrating the radiation energy; and causing the concentrated radiation energy to enter the chamber through the window to change the temperature of a semiconductor substrate disposed in the interior of the chamber.

These and other features and advantages of the present invention will be more readily apparent from the detailed description of the embodiments set forth below taken in conjunction with the accompanying drawings.

DETAILED DESCRIPTION

Figure 1:
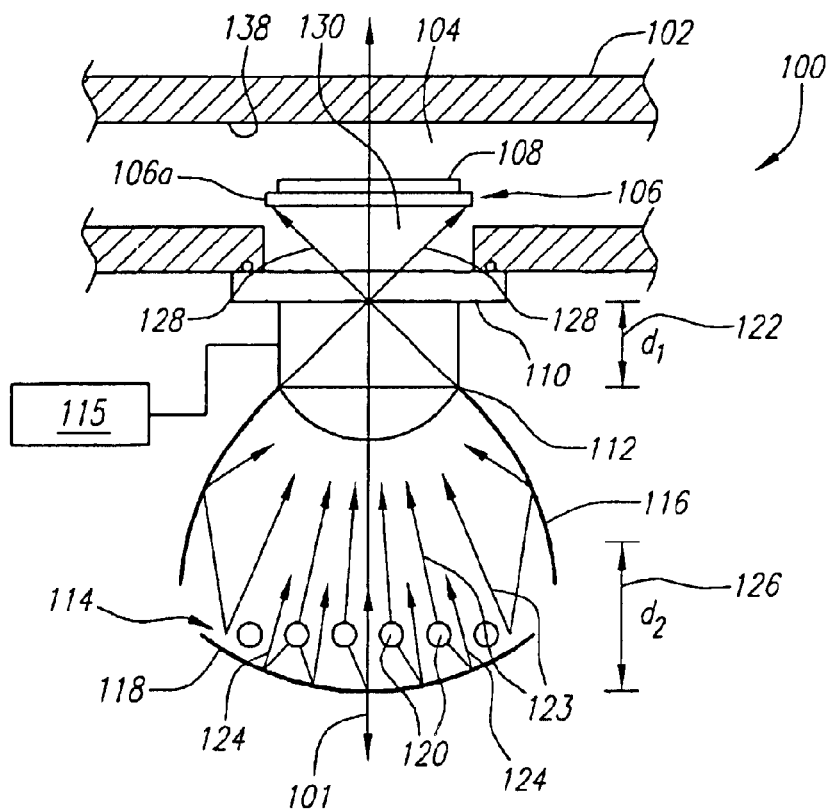
FIG. 1 is a simplified cross-sectional view of one embodiment of the present invention.

FIG. 1 is a simplified representation of the wafer heating apparatus of the present invention. Heating apparatus 100 includes a processing chamber 102 defining a processing area 104. Optionally, disposed within processing area 104 is a heat absorbing member 106 used to support a single wafer 108 during processing. A window 110 is formed or mounted onto processing chamber 102 to provide optical access along an optical path 101 to processing area 104. External to processing chamber 102 and positioned substantially along optical path 101 are a radiation focusing assembly 112, a radiation source 114, and a strategically positioned radiation reflecting device 118.

It should be understood that optical path 101 is represented by a line segment merely to provide an illustrative representation of the line-of-sight access through window 110 into process chamber 102 upon which some of the components of heating apparatus 100 are generally aligned. Optical path 101 is shown perpendicular to window 110 only by example and should not be considered as limiting in any manner.

In accordance with the present invention, processing chamber 102 can be an RTP chamber, such as those used in thermal anneals. In other embodiments, processing chamber 102 may be used for dopant diffusion, thermal oxidation, nitridation, chemical vapor deposition, and similar processes.

Processing chamber 102 includes an opening (not shown) on one end of processing chamber 102, which provides access for the loading and unloading of wafer 108 before and after processing. The opening may be a relatively small opening, but large enough to accommodate a wafer of between about 0.5 mm to 2 mm thick and up to 300 mm (~12 in.) in diameter, and a loading device, such as the arm and end effector of a robot. Processing chamber 102 may be constructed with a minimal internal volume-surrounding wafer 108. As a result, heating apparatus 100 may be made smaller, requiring less floor space. Preferably, processing chamber 102 is made of a transparent quartz or similar material.

Wafer 108 is positioned within processing chamber 102 supported on a wafer support device 106, which supports the single wafer 108 within processing area 104. In one embodiment, wafer support device 106 allows a substantial amount of the surface of wafer 108 to be exposed along optical path 101 to window 110 or, if provided, to heat absorbing member 106a.

In one embodiment, heat absorbing member 106a supports wafer 108 spaced therefrom on standoffs (not shown) or in contact therewith. The standoffs may be any high temperature resistant material, such as quartz, which may have a height of between about 50 $\mu$m and about 20 mm. Standoffs contact wafer 108 with a minimal amount of surface area thus leaving a substantial amount of the wafer surface area exposed to heat absorbing member 106a. In most embodiments, processing chamber 102 requires no internal moving parts to position wafer 108, such as lift-pins, actuators, and the like. Alternatively, in some embodiments, processing chamber 102 may use moveable standoffs or lift-pins to position wafer 108 on beat absorbing member 106a.

Heat absorbing member 106a can be made of a heat absorbing material, such as graphite, SiC, or a similar material. Heat absorbing member 106a and may have a variable thickness, ranging from between about 0.5 mm and about 20 mm.

In one embodiment, as shown in FIG. 1, heat absorbing member 106a can be positioned operationally along optical path 101, in-line with window 110. In one embodiment, window 110 may be fused silica, quartz, sapphire, or other material, which is sufficiently transparent in the visible and near IR portion of the electromagnetic spectrum. Window 110 may have a thickness of between about 1 mm and about 5 mm and a diameter that is at least as great as or greater than the diameter of wafer 108 or heat absorbing member 106a.

FIG. 1 also illustrates radiation focusing assembly 111 positioned external to processing chamber 102 and disposed along optical path 101 between radiation energy source 114 and window 110. In one embodiment, radiation focusing assembly 111 includes a single radiation focusing lens 112 or, alternatively, a radiation focusing lens group 112 (i.e. a plurality of lenses 112 used in conjunction with one another). Focusing lens 112 may include any conventional type of lenses, the use and function of which are well known in the art. For example, in one embodiment, lens 112 may be a Fresnel lens, which is a thin optical lens consisting of concentric rings of segmental lenses and having a short focal length. In other embodiments, lens 112 is a convex or concave lens (or a combination thereof). Radiation focusing assembly 111 may optionally include a focus mechanism 115 and a radiation collector 116.

Focus mechanism 115 can be coupled to radiation focusing assembly 111 to move radiation focusing lens 112 along optical path 101 so that radiation energy from radiation energy source 114 transmitted along optical path 101 into window 110 can vary in magnification within a focus range.

Focus mechanism 115 is coupled to a support structure, which allows for the automatic or manual movement of radiation focusing assembly 111. For example, focus mechanism 115 can include a linear actuator assembly, which provides a conventional means for radiation focusing assembly 111 to be operable to move a distance $d_1$ along optical path 101, as indicated in FIG. 1 by arrow 122, between a position proximate to and a position distant from window 110. The linear actuator assembly may include, but is not limited to, conventional drivers and motion translation mechanisms, such as linear guides and linear rollers, which can be urged manually, and linear motors, stepper motors, hydraulic drives, and the like, which may be automated using gears, pulleys, chains, and the like. The benefit of being able to move the position of radiation focusing assembly 111 is that the area to be heated can be controlled without modifying any parts internal to processing chamber 102. In addition, the achievable temperature can be varied.

Radiation energy source 114 provides radiation energy in accordance with the present invention. In one embodiment, radiation energy source 114 may include a bank of high-intensity lamps of the type conventionally used in lamp heating operations, which generally provide radiation energy as represented by rays 123 in FIG. 1. In one embodiment, radiation energy source 114 includes a filament-less lamp, such as a high-power arc lamp. In another embodiment, radiation energy source 114 may include a bank of well-known tungsten-halogen lamps. Typically, the power requirement for each lamp 120 is between about 500 Watts and about 50 kWatts.

Reflector 118 may be positioned on a side of radiation energy source 114 opposed from radiation lens assembly 111 to efficiently collect the radiation energy emitted from radiation source 114 and direct the reflected energy as desired. As described in greater detail below, in one embodiment, reflector 118 can be used to direct radiation energy from radiation energy source 114 to radiation focusing lens 112. In this embodiment, radiation energy is reflected as generally indicated by representative rays 124. It should be understood that radiation energy from radiation energy source 114 is not limited to any specific direction, and rays 123 and 124 indicate only a reasonable approximation.

In one embodiment, radiation energy source 114 and reflector 118 are moveable along optical path 101 a distance $d_2$, as represented by arrow 126. In this manner, the intensity of the radiation energy can be varied along optical path 101 as a function of the distance $d_2$ of radiation energy source 114 from radiation focusing assembly 111. This embodiment may be most beneficial when distance $d_2$ is fixed or physically limited.

Figure 2:
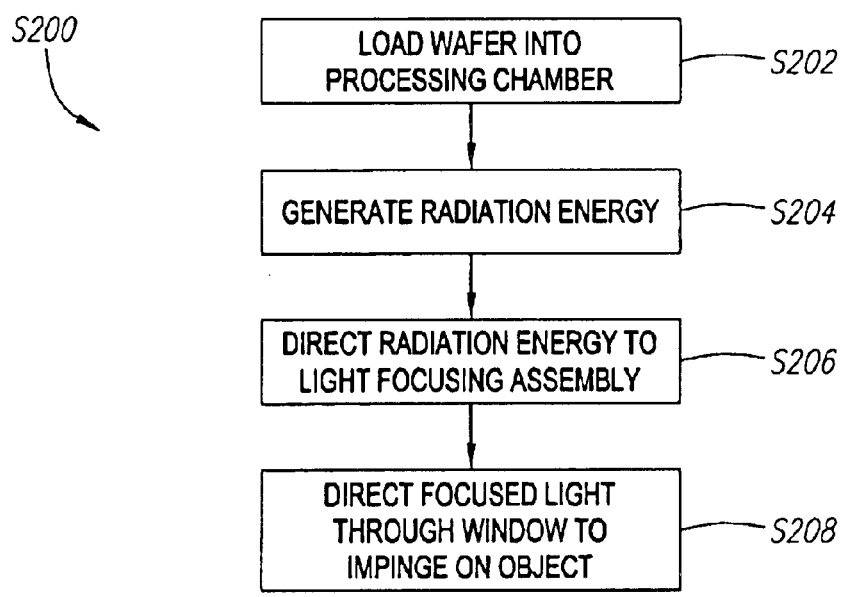
FIG. 2 is a flow diagram illustrating an operational method for using the apparatus of FIG. 1 in accordance with the present invention.
Figure 3:
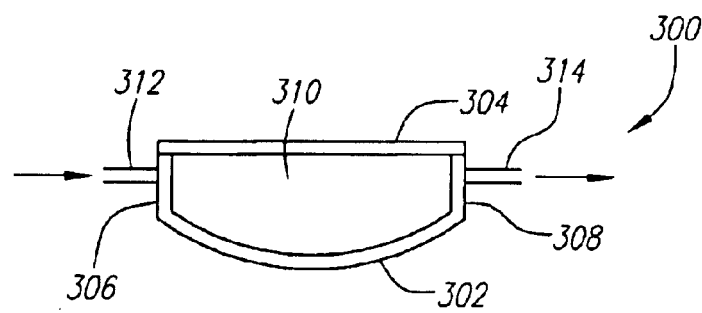
FIG. 3 is an embodiment of a lens including a cooling means in accordance with the present invention.

Referring now to FIGS. 1 and 2, in one operational embodiment (S200), a typical semiconductor loading robot (not shown) rotates toward a wafer cassette or other wafer storage device (not shown), picks up wafer 108, and loads the wafer into processing chamber 102 (S202), which may be at atmospheric pressure or under vacuum. The robot loader places wafer 102 onto wafer support device 106, such as heat absorbing member 106a or, alternatively onto standoffs. The robot loader then retracts and, subsequently, the processing of wafer 108 can begin.

To raise the temperature of wafer 108 to a processing temperature, such as between a range of about 100° C. and about 1800° C. radiation energy source 114 is activated (S204). Radiation energy along rays 123 and 124 from radiation energy source 114 travel toward radiation focusing assembly 111 (S206). The amount of radiation energy generated can be varied depending on the temperature requirements of the semiconductor wafer processing operation.

The radiation energy that reaches radiation focusing assembly 111 may be received directly into radiation focusing lens 112. In addition, radiation energy collector 116 can be used to capture and redirect radiation energy into radiation focusing lens 112 that would otherwise have gone astray.

Rays 128 outline a representative beam 130 of focused radiation energy which leaves radiation focusing lens 112 and travels through window 110 of processing chamber 102. Since radiation focusing assembly 111 is positioned along optical path 101, a substantial amount of radiation energy which travels through focusing lens 112 will necessarily travel along optical path 101 into window 110. To increase or decrease the width of beam 130, radiation focusing assembly 111 can be moved toward window. 110 along optical path 101 the desired distance $d_1$. Alternatively, in the event distance $d_1$ is a fixed or limited distance, radiation energy source 114 and reflector 118 can also be moved a distance $d_2$ along optical path 101 to achieve a similar result.

In one embodiment, wafer 108 is positioned in processing chamber 102 on wafer support device 106 with unobstructed exposure of wafer 108 along optical path 101. In this embodiment, focused beam 130 travels through window 110 to impinge directly on at least one surface of wafer 108 (S208). The focused radiation energy causes the temperature of wafer 108 to increase to between about 900° C. and about 1200° C.

In another embodiment, focused beam 130 travels through window 110 to impinge on heat absorbing member 106a (S208). The focused radiation energy causes the temperature of heat absorbing member 106a to increase. In one embodiment, the temperature of heat absorbing member, 106a can be raised up to between about 900° C. and about 1200° C. The temperature of wafer 108 disposed on or near heat absorbing member 106a correspondingly increases to allow the desired processing of wafer 108 to commence.

Heat absorbing member 106a provides temperature uniformity through heat diffusion and removes dependency on emissivity. In addition, heat absorbing member 106a can reduce gravitational stress from the weight of the wafer.

In one embodiment, an internal wall surface 138 opposed to window 110 can be coated with a reflective material, such as gold and silver, with or without a UV protection layer, to create a substantially mirror surface. In this manner, any portion of beam 130 which impinges on wall surface 138 can be reflected toward wafer 108.

Figure 4:
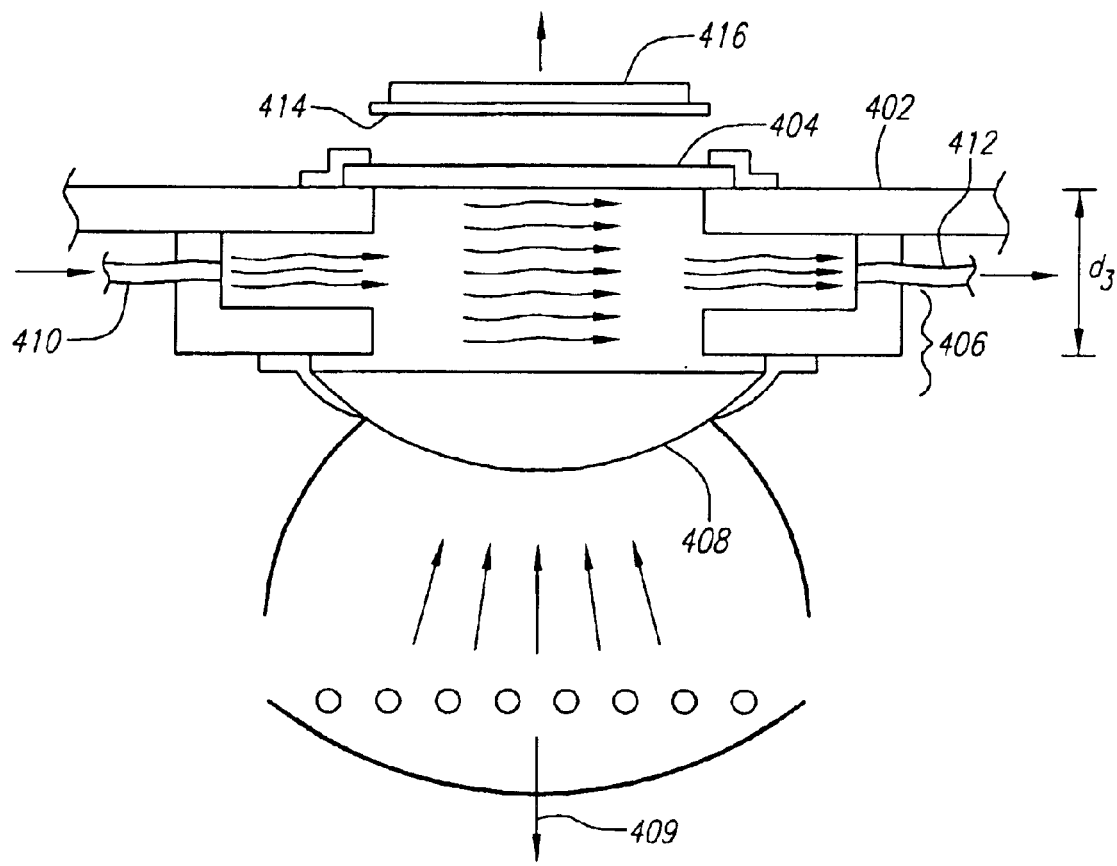
FIG. 4 is a simplified illustration of a mechanism for cooling the radiation focusing lens in accordance with an embodiment of the present invention.

It should be understood that radiation energy provided by radiation energy source 114 can heat lens 112. In some embodiments, a cooling means can be provided to ensure that lens 112 does not overheat so as to become in operative. FIG. 4 illustrates one embodiment of a focusing device 300 that includes a cooling means. In this embodiment, focusing device 300 forms an enclosure having a first side 302 of the enclosure including a lens. A second side 304 of the enclosure can be a non-focusing portion or optionally, can also be a lens. The enclosed walls 302, 304, 306 and 308 of focusing device 300 define a passageway 310. On either wall 306 and 308 are outlets 312 and 314 through which a fluid can be made to flow.

In operation as a fluid passes into outlet 312, through passageway 310, and out from outlet 314, heat energy from walls 302, 304, 306, and 308 is transferred to the fluid and removed from the enclosure.

FIG. 4 is a simplified illustration of another embodiment of a mechanism for cooling the radiation focusing lens in accordance with an embodiment of the present invention. In this embodiment, a processing chamber 402 includes a window 404 mounted thereto or formed thereon. The window may be held to processing chamber 402 using, for example, clamps.

Radiation focusing assembly 406, including radiation focusing lens 408 is coupled to processing chamber 402, such that radiation focusing lens 408 and window 404 are aligned along optical path 409. In this embodiment, distance $d_3$ between lens 408 and window 404 is fixed. Radiation focusing assembly 406 defines an enclosure around window 404, which includes ducts 410 and 412 which allow for the flowing of a liquid or gas there through. The flowing liquid or gas removes heat from radiation focusing lens 408 as the fluid or gas passes over the lens. The flowing liquid and gas can be any substance which readily absorbs heat, yet allows the desired wavelength of photon energy to pass, for example, pure water, filtered air and dye liquids.

Figure 5:
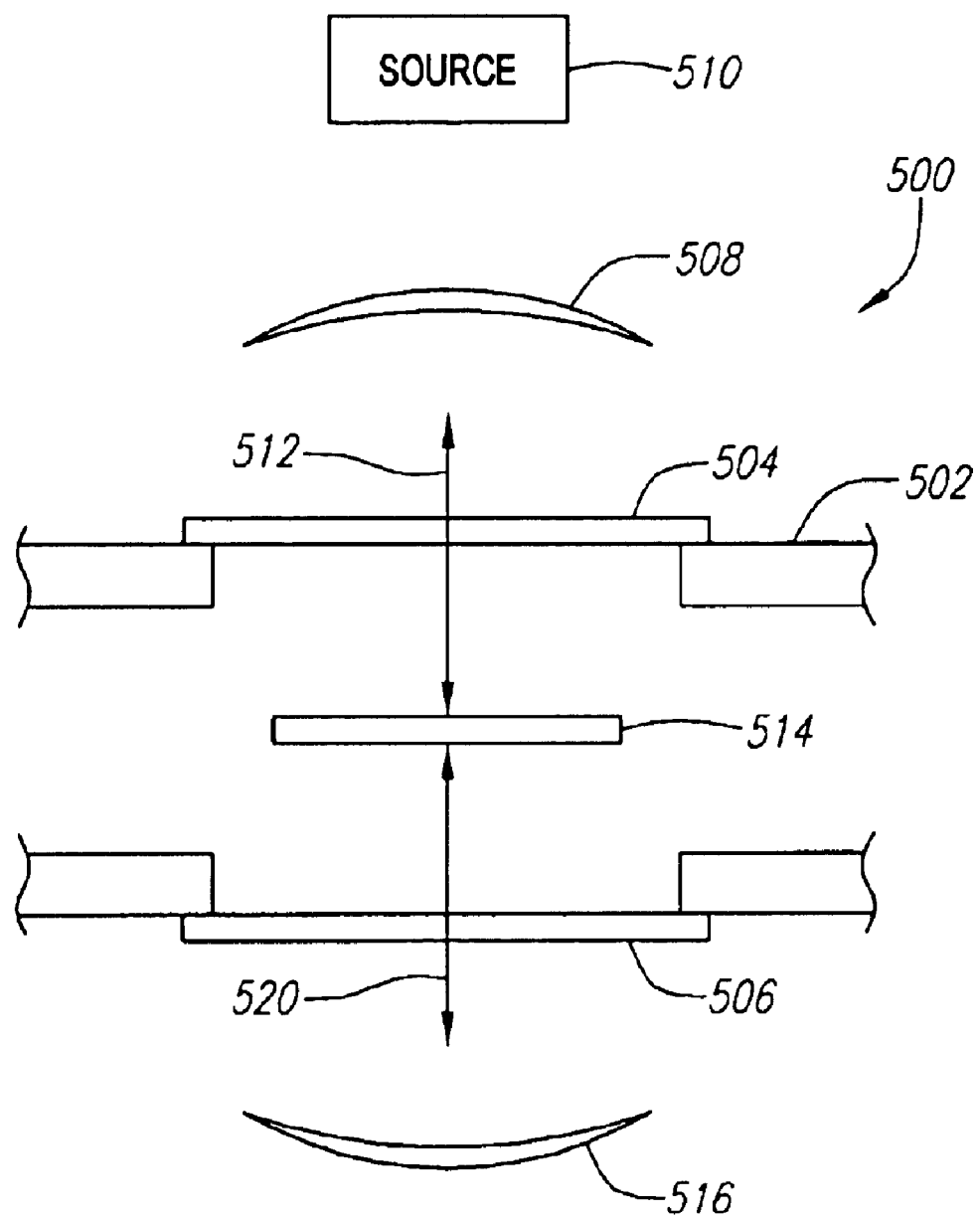
FIG. 5 is, a simplified illustration of yet another embodiment of the present invention.

It should be understood that a cooling means, such as those described above or any well-known means for removing heat from a lens, can be used with any of the embodiments of the present invention, FIG. 5 is a simplified illustration of yet another embodiment of the present invention. In this embodiment, a wafer heating apparatus 500 includes a process chamber 502 having more than one window, for example window 504 and window 506. Each of the windows can provide optical access to the interior of process chamber 502. A focusing assembly and radiation energy source can be aligned along an optical path defined by each window. For example, windows 504 and 506 provide optical access to the interior of process chamber 502 and wafer 514. In this example, a first focusing assembly 508 and a first radiation energy source 510 can be aligned along an optical path 512 defined by window 504 to impinge on a first surface of wafer 514. A second focusing assembly 516 and a second radiation energy source 518 can be aligned along an optical path 520 defined by window 506 to impinge on a second surface of wafer 514. In this manner, radiation energy can be allowed to impinge on multiple surfaces of wafer 514.

Alternatively, a heat absorbing member (e.g. FIG. 1) can be positioned proximate or in contact with either the first or second surface of wafer 514. The heat absorbing member can be heated by the radiation energy entering windows 504 or 506 to subsequently heat wafer 514.

Radiation focusing assemblies 508 and 516 as well as radiation energy sources 510 and 518 are expected to perform substantially as described with regard to similar components in other embodiments.

Having thus described the preferred embodiments, persons skilled in the art will recognize that changes may be made in form and detail without departing from the spirit and scope of the invention. Thus the invention is limited only by the following claims.

What is claimed is:

1. An apparatus for heating a semiconductor substrate comprising:

a chamber including a window providing optical access to the interior of said chamber;

radiation energy focusing assembly positioned in an optical path with said window to focus radiation energy emitted from a radiation energy source into said window, said focused radiation energy used to heat a semiconductor substrate disposed in said chamber; and a heatable member positioned in said chamber in an optical path with said window; wherein said semiconductor substrate is disposed on said heatable member and wherein said heatable member is heated by said focused radiation energy.

2. The apparatus of claim 1, further comprising an actuator for moving said focusing assembly between a first position proximate to said window and a second position distant from said window to focus said radiation energy emitted from said radiation energy source.

3. The apparatus of claim 1, wherein said focusing assembly is positioned data fixed distance from said window to focus said radiation energy emitted from said radiation energy source.

4. The apparatus of claim 1, wherein said window comprises a clear quartz window mounted on a side wall of said chamber.

5. The apparatus of claim 1, wherein said focusing assembly comprises at least one lens.

6. The apparatus of claim 1, wherein said focusing assembly comprises a plurality of lenses used in conjunction to provide said focused radiation energy.

7. The apparatus of claim 1, further comprising a cooling means for lowering the temperature of components of said focusing assembly.

8. The apparatus of claim 1, wherein said focusing assembly comprises a radiation energy collector coupled to said lens for collecting at least a portion of said radiation energy emitted by said radiation energy source and directing said at least a portion of said radiation energy at said focusing assembly.

9. The apparatus of claim 1, further comprising a reflector disposed proximate to said radiation energy source for directing said radiation energy emitted by said radiation energy source at said focusing assembly.

10. The apparatus of claim 1, further comprising means for moving said radiation energy source to a first position proximate to said focusing assembly and a second position distant from said focusing to adjust the intensity of said radiation energy.

11. A method for processing a semiconductor substrate comprising:

providing a chamber including a window which allows for optical access along an optical path to an interior of said chamber;

generating a radiation energy from a radiation source;

concentrating said radiation energy; and causing said concentrated radiation energy to enter said chamber through said window to change the temperature of a semiconductor substrate disposed in said interior of said chamber by causing said concentrated radiation energy to impinge on a heat absorbing member upon which said semiconductor substrate is positioned to heat said semiconductor substrate.

12. The method of claim 11, wherein said concentrating said radiation energy comprises directing said radiation energy through at least one lens to focus said radiation energy.

13. The method of claim 11, wherein said concentrating said radiation energy comprises further comprises moving a focusing assembly including at least one lens between a first position and a second position to focus said radiation energy.

14. The method of claim 11, further comprising flowing a heat absorbing fluid proximate to said lens to transfer heat between said lens and said fluid.

15. An apparatus for heating a semiconductor substrate comprising:

a processing chamber including a window providing optical access along a first optical path to the interior of said processing chamber;

a radiation energy source external to said processing chamber which provides radiation energy along said first optical path;

a radiation energy focusing assembly including at least one lens positioned in said first optical path to focus said radiation energy emitted from said radiation energy source, said focused radiation energy used to heat a semiconductor substrate disposed in said chamber; and a heatable member positioned in said chamber in an optical path with said window, wherein said semiconductor substrate is disposed on said heatable member and wherein said heatable member is heated by said focused radiation energy.

16. The apparatus of claim 15, further comprising an actuator for moving said radiation energy focusing assembly between a first position proximate to said window and a second position distant from said window to focus said radiation energy emitted from said radiation energy source.

17. The apparatus of claim 15, wherein said radiation energy focusing assembly is positioned at a fixed distance from said window to focus said radiation energy emitted from said radiation energy source.

18. The apparatus of claim 15, wherein said radiation energy focusing assembly comprises at least one lens selected from the group of concave, convex, and Fresnel lenses and combinations thereof.

* * * * *